US005675535A

United States Patent [19]
Jinbo

[11] Patent Number: 5,675,535
[45] Date of Patent: Oct. 7, 1997

[54] SENSE AMPLIFIER HAVING A HIGH OPERATION SPEED AND A LOW POWER CONSUMPTION

[75] Inventor: Toshikatsu Jinbo, Tokyo, Japan

[73] Assignee: NEC Corporation, Tokyo, Japan

[21] Appl. No.: 590,342

[22] Filed: Jan. 23, 1996

[30] Foreign Application Priority Data

Jan. 23, 1995 [JP] Japan .................................. 7-007881

[51] Int. Cl.$^6$ ........................................................ G11C 7/02
[52] U.S. Cl. .................................. 365/185.2; 365/185.21; 365/205; 365/208
[58] Field of Search ............................ 365/205, 207, 365/208, 210, 185.2, 185.21; 327/52, 56

[56] References Cited

U.S. PATENT DOCUMENTS 5,197,028  3/1993  Nakai .................................. 365/185.21

OTHER PUBLICATIONS

D. Hoff et al., "A 23-ns 256K EPROM with Double-Layer Metal and Address Transition Detection", *IEEE Journal of Solid-State Circuits*, vol. 24, No. 5, Oct. 1989, pp. 1250–1258.

*Primary Examiner*—Joseph A. Popek
*Attorney, Agent, or Firm*—Sughrue, Mion, Zinn, Macpeak and Seas

[57] ABSTRACT

In a sense amplifier for use in a semiconductor memory having a plurality of memory cells, comprising first and differential amplifiers receiving a potential signal read out from a selected memory cell and a reference potential, and having an output for respectively outputting first and second outputs differentially amplified in a phase opposite to each other, a CMOS inverter circuit is composed of a PMOS transistor and a NMOS transistor having their gate connected in common to receive the output of second differential amplifier. The CMOS inverter circuit has a threshold level corresponding to an intermediate level between a high logic level and a low logic level of binary information. An amplifier circuit is composed of a PMOS transistor having the same characteristics and the same size as those of the PMOS transistor of the CMOS inverter circuit and on-off controlled by an output signal of the CMOS inverter circuit, and a NMOS transistor having the same characteristics and the same size as those of the NMOS transistor of the CMOS inverter circuit and on-off controlled by an output of the first differential amplifier. A drain of the PMOS transistor and a drain of the NMOS transistor of the amplifier circuit are connected to each other so as to constitute a signal output node.

5 Claims, 12 Drawing Sheets

SENSE AMPLIFIER HAVING A HIGH OPERATION SPEED AND A LOW POWER CONSUMPTION

BACKGROUND OF THE INVENTION

1. Field of the invention

The present invention relates to a sense amplifier, and more specifically to a sense amplifier used in a semiconductor memory.

2. Description of related art

As one kind of semiconductor memory, there is known a non-volatile semiconductor memory having a memory cell composed of an electrically programmable floating gate electric field transistor. For example, as shown in FIG. 1, this type of memory cell includes a drain diffusion region DA and a source diffusion region SA which are formed by ion-implanting arsenic (As) into a P-type substrate SB, and a floating gate FG and a control gate CG which are located on the P-type substrate SB, with an insulating film INS being interposed between the P-type substrate SB and the floating gate FG and between the floating gate FG and the control gate CG, the insulating film INS being further grown to cover the whole of the memory cell.

In the case of writing information into this type of memory cell, a high voltage on the order of 12 V is applied to the control gate and a high voltage on the order of 9 V is applied to a drain electrode (not shown, and called simply a "drain" hereinafter) connected to the drain diffusion region DA, with a source electrode (not shown, and called simply a "source" hereinafter) connected to the source diffusion region SA being brought to a ground potential, so that electrons are injected into the floating gate FG in the form of hot carriers, with the result that a threshold viewed from the control gate CG is made higher than that in an initial condition. Binary information can be stored by the difference in the threshold voltage.

Referring to FIG. 2, there is shown a characteristics graph showing an initial condition (called a "non-written condition" hereinafter) and a written condition of the memory cell. The memory cell in the non-written condition becomes conductive with application of a control gate voltage on the order of 2 V, as seen from a solid line NWR in FIG. 2. On the other hand, the memory cell in the written condition becomes conductive with application of the control gate voltage of not less than 6 V, as seen from a solid line WR in FIG. 2. Accordingly, assuming that the control gate voltage is on 5 V, the memory cell in the non-written condition is conductive, but the memory cell in the written condition is non-conductive. Therefore, it is possible to read out the information by detecting this difference of current between the conductive condition and the non-conductive condition.

In an actual semiconductor memory, a plurality of memory cells as mentioned above are arranged in the form of an array, and a selective writing and reading is made for the memory cells arranged in the form of an array. Referring to FIG. 3, there is shown a circuit diagram illustrating a conventional construction of the actual semiconductor memory composed of memory cells as mentioned above. For simplification of the description, the shown example includes a memory cell array 100 composed of four memory cells MC11, MC12, MC21 and MC22.

Column lines DY1 and DY2 are connected to a bias circuit 400A through transistors T201 and T202 of a column selection circuit 200, respectively, which are controlled by output signals SY1 and SY2 of a column decoder 700, respectively. A control gate of the memory cells are connected to row lines SX1 and SX2 controlled by a row decoder 600. In the shown example, in the case of selecting the memory cell MC11, the row line SX 1 is brought to a selecting level (for example, 5 V) by the row decoder 600, and the output signal SY1 is also brought to a selecting level (for example, 5 V) by the column decoder 700 so as to put the transistor T201 into the conductive condition, so that the memory cell MC11 positioned at an intersection between the row line SX1 and the column line DY1 is selected.

A reference cell RMC is constituted of a memory cell equivalent to the memory cells MC11 to MC22, and is connected to a bias circuit 400B through a transistor T200 equivalent to the transistors T201 and T202 of the column selection circuit 200, so that the bias circuit 400B outputs a reference voltage Vr. A sense amplifier 500 compares a voltage Vs outputted from the bias circuit 400A with the reference voltage Vr of the bias circuit 400B, so as to output a data output signal SDO dependent upon a current flowing through the selected memory cell.

Furthermore, the circuit construction of the semiconductor memory will described in more detail with reference to FIG. 4 and 5A to 5C. FIG. 4 shows a detailed circuit construction of the sense amplifier 500 shown in FIG. 3.

In FIG. 4, the memory cell selected in the memory cell array 100 is represented by MCij. The selected memory cell MCij is connected through a transistor T20i of the column selection circuit 200 to an input terminal INA of the bias circuit 400A. As shown in FIG. 5A, the bias circuit 400A includes a P-type MOS transistor T401 and an N-type MOS transistor T402 connected in series between a power supply voltage Vcc and the input terminal INA of the bias circuit 400A in the named order, and an inverter IV401 having an input connected to the input terminal INA of the bias circuit 400A and an output connected to a gate of the MOS transistor T402. A gate of the MOS transistor T401 is connected to a drain of the MOS transistor T401 and a drain of the MOS transistor T402, and a connection node between the drain of the MOS transistor T401 and the drain of the MOS transistor T402 outputs an output signal Vs of the bias circuit 400A.

When the selected memory cell MCij is in the written condition, the selected memory cell is non-conductive, and the input terminal INA of the bias circuit 400A is charged up through the MOS transistors T401 and T402. When the input terminal INA of the bias circuit 400A becomes higher than a logic threshold level of the inverter IV401, the output of the inverter IN401 is brought a low level, so that the MOS transistor T401 is rendered non-conductive, with the result that the output signal Vs of the bias circuit 400A is brought to a high level by action of the MOS transistor T401. At this time, assuming that the power supply voltage Vcc is 5 V and a threshold voltage Vtp of the MOS transistor T401 is −1 V, the potential of the high level becomes Vcc−|Vtp|=4 V.

When the selected memory cell MCij is in the non-written condition, the selected memory cell is conductive, and the input terminal INA of the bias circuit 400A is discharged through the transistor T20i of the column selection circuit 200 and the memory cell MCij, so that the output signal Vs of the bias circuit 400A is brought to a low level. The potential of this low level is determined by a resistance division ratio between the MOS transistors T401 and T402 and the transistor T20i of the column selection circuit 200 and the memory cell MCij, which are connected in series between the power supply voltage Vet and the ground. For the following explanation, the output signal Vs of the bias circuit 400A in this situation is assumed to be 2 V.

The reference cell RMC is a transistor in the non-written condition equivalent to the memory cell MCij, and constitutes the reference current generating circuit 300 in cooperation with the N-type MOS transistor T200 equivalent to the transistor T20i of the column selection circuit 200. The MOS transistor T200 is connected to an input terminal INB of the bias circuit 400B, and the power supply voltage Vcc is applied to a gate of the reference cell RMC and the MOS transistor T200. As shown in FIG. 5B, the bias circuit 400B is constituted similarly to the bias circuit 400A, but the size of a MOS transistor T403 of the bias circuit 400B is adjusted so as to ensure that the output potential Vr of the bias circuit 400B is at an intermediate level between the high level voltage 4 V and the low level voltage 2 V in the output signal Vs of the bias circuit 400A, for example, at 3 V.

The outputs Vs and Vr of the two bias circuits 400A and 400B are connected to two differential amplifiers 1A and 1B. As shown in FIG. 5C, each of the differential amplifiers 1A and 1B includes a P-type MOS transistor T11 and an N-type MOS transistor T12 connected in series between the power supply voltage Vcc and the ground, and a P-type MOS transistor T13 and an N-type MOS transistor T14, connected in series between the power supply voltage Vcc and the ground. A drain and a gate of the MOS transistor T12 are connected in common to a gate of the MOS transistor T14, so that a current mirror is constituted. A gate of the transistor T11 and a gate of the transistor T13 respectively constitute inputs IN1 and IN2 of the differential amplifier, and a connection node between the transistors T13 and T14 constitutes an output OUT of the differential amplifier.

Now, operation of these amplifiers 1A and 1B will be described with reference to FIGS. 6A and 6B.

FIG. 6A illustrates a voltage (OUT)—current characteristics graph of the differential amplifier 1A. The reference potential Vr connected to the input terminal IN2 is ceaselessly at 3 V, and a current flowing through the MOS transistor T13 has a characteristics shown in a solid line C11. If the selected memory cell is in the non-written condition, the voltage Vs connected to the input terminal IN1 is 2 V, so that the MOS transistor T11 is conductive, and therefore, a current flows through the MOS transistor T12, with the result that a current flows through the MOS transistor T14 which constitutes the current mirror in cooperation with the MOS transistor T12. A current flowing through the MOS transistor T14 has a characteristics shown in a solid line C12. As a result, at the output OUT (VA1) of the differential amplifier 1A, there is outputted a low level which is V11 at an intersection between the solid lines C11 and C12.

On the other hand, if the selected memory cell is in the written condition, the voltage Vs connected to the input terminal IN1 is 4 V, so that the MOS transistor T11 is non-conductive, and therefore, a current does not flow through the MOS transistor T12, with the result that a current does not flow through the MOS transistor T14 which constitutes the current mirror in cooperation with the MOS transistor T12. A current flowing through the MOS transistor T14 has a characteristics shown in a solid line C13 (in FIG. 6A, this characteristics is depicted in exaggeration to have some degree of current so that this characteristics line can be distinguished from the axis of abscissas). As a result, at the output OUT (VA1) of the differential amplifier 1A, there is outputted a high level which is V12 at an intersection between the solid lines C11 and C13.

FIG. 6B illustrates a voltage (OUT)—current characteristics graph of the differential amplifier 1B. The reference potential Vr connected to the input terminal IN1 is ceaselessly at 3 V, and the MOS transistor T11 is conductive, so that a current flows through the MOS transistor T12. Therefore, a current flows through the MOS transistor T14 which constitutes the current mirror in cooperation with the MOS transistor T12. A current flowing through the MOS transistor T14 has a characteristics shown in a solid line C21. If the selected memory cell is in the non-written condition, the voltage Vs connected to the input terminal IN2 is 2 V, so that the MOS transistor T13 is conductive, and therefore, a current flowing through the MOS transistor T13 has a characteristics shown in a solid line C22. As a result, at the output OUT (VA2) of the differential amplifier 1A, there is outputted a high level which is V21 at an intersection between the solid lines C21 and C22.

On the other hand, if the selected memory cell is in the written condition, the voltage Vs connected to the input terminal IN2 is 4 V, so that the MOS transistor T13 is non-conductive. A current flowing through the MOS transistor T13 has a characteristics shown in a solid line C23 (in FIG. 6B, this characteristics is depicted in exaggeration to have some degree of current so that this characteristics line can be distinguished from the axis of abscissas). As a result, at the output OUT (VA2) of the differential amplifier 1A, there is outputted a low level which is V22 at an intersection between the solid lines C21 and C23.

As mentioned above, if the selected memory cell MCij is in the non-written condition, an output VA1 of the differential amplifier 1A is at the low level, and an output VA2 of the differential amplifier 1B is at the high level. On the other hand, when the selected memory cell MCij is in the written condition, the output VA1 of the differential amplifier 1A is at the high level, and the output VA2 of the differential amplifier 1B is at the low level.

The outputs VA1 and VA2 of these differential amplifiers 1A and 1B are connected to a third differential amplifier 5 composed of P-type MOS transistors T51 and T53 and N-type MOS transistors T52 and T54 connected as shown. A connection node between the MOS transistors T51 and T52 constitutes an output node DAO of this differential amplifier 5.

If the selected memory cell is in the non-written condition, the output VA1 is at the low level and the output VA2 is at the high level, so that the MOS transistor T54 having a gate connected to the output VA2 becomes conductive, and therefore, the MOS transistor T53 connected in series with the MOS transistor T54 also becomes conductive. Furthermore, the MOS transistor T51 constituting a current mirror in cooperation with the MOS transistor T53 also becomes conductive. On the other hand, since the MOS transistor T52 having a gate connected to the output VA1 is non-conductive, the output node DAO of the differential amplifier 5 is charged to the high level by action of the MOS transistor T51.

If the selected memory cell is in the written condition, the output VA1 is at the high level and the output VA2 is at the low level, so that the MOS transistor T54 having the gate connected to the output VA2 becomes non-conductive, and therefore, the MOS transistor T53 connected in series with the MOS transistor T54 also becomes non-conductive. Furthermore, the MOS transistor T51 constituting the current mirror in cooperation with the MOS transistor T53 also becomes non-conductive. On the other hand, since the MOS transistor T52 having the gate connected to the output VA1 becomes conductive, the output node DAO of the differential amplifier 5 is discharged to the low level by action of the MOS transistor T52.

The output node DAO of the differential amplifier 5 is connected to a latch circuit 3, which is, as well known to persons in the art, composed of, two CMOS inverters IV31 and IV32, and two transfer gates TG31 and TG32, each of which is formed of parallel connected P-type and N-type MOS transistors. The output node DAO of the differential amplifier 5 is connected through the transfer gate TG31 to an input of the CMOS inverter IV31, which in turn have an output connected to an input of the CMOS inverter IV32 and constitutes an output of this latch circuit 3. An output of the CMOS inverter IV32 is connected through the transfer gate and TG32 to the input of the CMOS inverter IV31. Each of the transfer gates TG31 and TG32 is composed of one N-type MOS transistor and one P-type MOS transistor connected in parallel to each other, and these transfer gates TG31 and TG32 are controlled by the control signal BC in such a manner that when the control BC is at the high level, the transfer gate TG31 is off and the transfer gate TG32 is on, and when the control BC is at the low level, the transfer gate TG31 is on and the transfer gate TG32 is off. The output of this latch circuit 3 constitutes the data output SDO of the sense amplifier 500.

Now the reason for necessity of the latch circuit 3 will be described. If the input signals VA1 and VA2 of the differential amplifier 5 are caused to change between the high level and the low level, a transition time between the high level and the low level inevitably becomes long, and therefore, the operation of the sense amplifier becomes slow. In this sense amplifier, therefore, in order to speed up the operation of the differential amplifier 5, the input signals VA1 and VA2 of the differential amplifier are equalized so as to be set to an intermediate level between the high level and the low level at an initial stage of a data reading cycle, so that each of the two inputs of the differential amplifier 5 changes from the intermediate level to the high level or the low level, depending upon the input signals VA1 and VA2 read out. For this purpose, an equalizing circuit 4x is provided, which includes an N-type MOS transistor T41 which is connected between the outputs OUT of the two differential amplifiers 1A and 1B and which has gate controlled by a control signal BC, so that when the control signal BC is at a high level, the MOS transistor T41 is rendered conductive so as to interconnect between the outputs OUT of the two differential amplifiers 1A and 1B, thereby to equalize the output signals VA1 and VA2 of the two differential amplifiers 1A and 1B.

During a period in which the input signals VA1 and VA2 of the differential amplifier 5 are equalized by the equalizing circuit 4x (namely, during a high level period of the control signal BC), the output signal DAO of the differential amplifier 5 becomes unstable. Therefore, it is necessary to hold the output signal DAO of the differential amplifier 5 just before the control signal BC is brought to the high level, and to cut off the output signal DAO of the differential amplifier 5 during the high level period of the control signal BC. For this purpose, the latch circuit 3 is provided.

Incidentally, the sense amplifier 500 is constituted of the differential amplifiers 1A and 1B, the equalizing circuit 4x, the differential amplifier 5 and the latch circuit 3.

Now, the operation of the circuit will be described with reference to FIG. 7, which is a timing chart illustrating the operation of the sense amplifier.

Before a time t1, a memory cell in the written condition is selected, so that the output data SDO is at the high level. Here, assume that, at the time t1, an address signal AD (ADc+ADr in FIG. 3) changes to select a memory cell in the non-written condition. During a period from a time t2 to a time t3, the control signal BC is brought to the high level, the input signals VA1 and VA2 of the differential amplifier 5 are equalized. In the equalizing period, the column line is discharged by the selected memory cell, so that the output Vs of the bias circuit 400A changes from 4 V to 2 V. Thereafter, at the time t3, the control signal BC is brought to the low level, and therefore, the equalizing is completed. As a result, the voltage VA1 changes to the low level and the voltage VA2 changes to the high level, so that the output signal DAO of the differential amplifier 5 is brought to the high level, and therefore, the output data signal SDO changes to the low level.

Also assume that at a time t4, the address signal AD changes so as to select a memory cell in the written condition. During a period from a time t5 to a time t6, the control signal BC is brought to the high level, the input signals VA1 and VA2 of the differential amplifier 5 are equalized again. In the equalizing period, the column line connected to the selected memory cell is charged, so that the output Vs of the bias circuit 400A changes from 2 V to 4 V. Thereafter, at the time t6, the control signal BC is brought to the low level so as to terminate the equalizing. As a result, the voltage VA1 changes to the high level and the voltage VA2 changes to the low level, so that the output signal DAO of the differential amplifier 5 is brought to the low level, and therefore, the output data signal SDO changes to the high level.

In the above mentioned sense amplifier comprising the three differential amplifiers 1A, 1B and 5, the equalizing circuit 4x for speeding up the operation of the differential amplifier and the latch circuit 3, the input signals VA1 and VA2 of the differential amplifier 5 are at the intermediate level between the high level and the low level during the equalizing period and it becomes difficult to control the potential of the output data signal DAO. In particular, when the selected memory cell changes from the non-written memory cell to the written memory cell or from the written memory cell to the non-written memory cell in response to the change of the address, an error data is outputted temporarily.

This problem will be described in detail with reference to FIGS. 8A and 8B. FIG. 8A is a timing chart just before and just after the termination of the equalizing when the selected memory cell changes from the non-written memory cell to the written memory cell. In addition, in FIGS. 8A and 8B, Viv indicates a logic threshold value of the inverter IV31 in the latch circuit 3. In the case where during the equalizing period, the potential of the output signal DAO of the differential amplifier 5 had become lower than the logic threshold value Viv of the inverter IV31, in a process where the control signal BC changes toward the low level from a time t71, and where the output signal DAO changes toward the high level, the output signal DAO is lower than the logic threshold value Viv of the inverter IV31, during a period from the time t71 to a time t72, so that the output SDO of the latch circuit 3 temporarily outputs an error data of the high level.

FIG. 8B is a timing chart just before and just after the termination of the equalizing when the selected memory cell changes from the written memory cell to the non-written memory cell. In the case that during the equalizing period, the potential of the output signal DAO of the differential amplifier 5 had become higher than the logic threshold value Viv of the inverter IV31, in a process that the control signal BC changes toward the low level from a time t81 and the output signal DAO changes toward the low level, the output signal DAO is higher than the logic threshold value Viv of the inverter IV31, during a period from the time t81 to a time t82, so that the output SDO of the latch circuit 3 temporarily outputs an error data of the low level.

As mentioned above, because the output signal DAO of the differential amplifier 5 during the equalizing period is different from the logic threshold value Viv of the inverter IV31 in the latch circuit 3, an error data is temporarily outputted to the data output SDO, with the result that a data reading speed drops.

In addition, in the circuit construction of the conventional sense amplifier, even if it is so designed to make the level of the output signal DAO of the differential amplifier 5 during the equalizing and the logic threshold value Viv of the inverter IV31 in the latch circuit 3, consistent with each other, it is impossible to realize this, because of variation of the threshold voltages of MOS transistors occurring in the manufacturing process. Therefore, it is extremely difficult to prevent the outputting of the error data and the drop of the data reading speed.

As one general means for avoiding the temporary outputting of the error data, it is considered to make the control signal BC for controlling the MOS transistor T41 of the equalizing circuit 4x and the control signal BC applied to the latch circuit 3, independent of each other, to the effect that after the control signal BC for controlling the equalizing circuit 4x has changed and the output signal DAO of the differential amplifier 5 has become a sufficient high or low level, the control signal BC applied to the latch circuit 3 is caused to change. In this case, it is possible to prevent the temporary outputting of the error data, but, since it is necessary to introduce a time difference between the control signal for the equalizing circuit 4x and the control signal for the latch circuit 3, the resultant data reading speed becomes low.

Furthermore, since the MOS transistor T53 of the differential amplifier 5 is ceaselessly in a conducting condition, whenever the output signal VA2 of the differential amplifier 1B exceeds the threshold voltage of the MOS transistor T54, the current flows from the power supply voltage Vcc through these transistors T53 and T54, with the result that the consumed electric power increases.

In addition, IEEE Journal of Solid-State Circuits, October 1989, Vol. 24, No. 5, pages 1250-1258 discloses another sense amplifier, which however requires three differential amplifiers, similarly to the above mentioned prior art sense amplifier.

SUMMARY OF THE INVENTION

Accordingly, it is an object of the present invention to provide a sense amplifier which has overcome the above mentioned defect of the conventional one.

Another object of the present invention is to provide a sense amplifier, which is capable of preventing an error data outputting even if MOS transistors included in the sense amplifier has variations in the threshold voltage occurring in the manufacturing process, so that the dropping of the operation speed can be prevented and the power consumption can be reduced.

The above and other objects of the present invention are achieved in accordance with the present invention by a sense amplifier for use in a semiconductor memory having a plurality of memory cells, comprising:

a first differential amplifier receiving a potential signal read out from a selected memory cell and a reference potential, and having an output for outputting a first differentially amplified output;

a second differential amplifier receiving the potential signal read out from the selected memory cell and the reference potential, and having an output for outputting a second differentially amplified output amplified in a phase opposite to that of the first differential amplifier;

a first inverter circuit composed of a first MOS transistor of a first conductivity type and a second MOS transistor of a second conductivity type opposite to the first conductivity type, the first inverter circuit having a threshold level corresponding to an intermediate level between a high logic level and a low logic level of binary information, the first inverter circuit having an input receiving the second differentially amplified output and an output for outputting an inverted, signal of the second differentially amplified output; and an amplifier circuit composed of a third MOS transistor of the first conductivity type having the same characteristics and the same size as those of the first MOS transistor and having a gate receiving the inverted signal of the second differentially amplified output so as to be on-off controlled by the inverted signal of the second differentially amplified output, and a fourth MOS transistor of the second conductivity type having the same characteristics and the same size as those of the second MOS transistor and having a gate receiving the first differentially amplified output so as to be on-off controlled by the first differentially amplified output, a drain of the third MOS transistor and a drain of the fourth MOS transistor being connected to each other so as to constitute a signal output node.

More preferably, the sense amplifier in accordance with the present invention includes:

a latch circuit having an input connected to the signal output node of the amplifier circuit and including a second inverter circuit having the same circuit construction and the same threshold as those of the first inverter circuit and a transfer gate connected between the input of the latch circuit and an input of the second inverter circuit and on-off controlled by a control signal in such a manner that when the control signal is at a first level, the transfer gate transfers an output signal outputted from the signal output node of the amplifier circuit to the input of the second inverter circuit, and when the control signal is at a second level different from the first level, the latch circuit hold the output signal outputted from the signal output node of the amplifier circuit so as to cause the second inverter circuit to output a sense-amplified signal; and an equalizing circuit connected to the output of each of the first and second differential amplifiers, the input and the output of the first inverter circuit and the signal output node of the amplifier circuit, and controlled by the control signal so as to equalize a potential on the output of each of the first and second differential amplifiers, the input and the output of the first inverter circuit and the signal output node of the amplifier circuit when the control signal is at the second level.

In one embodiment, the equalizing circuit includes a fifth MOS transistor having a source and a drain connected to the output of the first differential amplifier and the output of the second differential amplifier, respectively, and a gate connected to receive the control signal, a sixth MOS transistor having a source and a drain connected to the input and the output of the first inverter circuit, respectively, and a gate connected to receive the control signal, a seventh MOS transistor having a source and a drain connected to the output of the first inverter circuit and the output of the amplifier circuit, respectively, and a gate connected to receive the control signal.

In a modified embodiment, the equalizing circuit includes a second transfer gate connected between the output of the first differential amplifier and the output of the second differential amplifier, a third transfer gate connected between the input and the output of the first inverter circuit, a fourth transfer gate connected between the output of the first inverter circuit and the output of the amplifier circuit, each of the second, third and fourth transfer gates being composed of a MOS transistor of the first conductivity type and another MOS transistor of the second conductivity type, which are connected in parallel to each other, a gate of the MOS transistor of the first conductivity type and a gate of the MOS transistor of the second conductivity type being controlled by the control signal in such a manner that when the control signal is at the second level, all of the second, third and fourth transfer gates are rendered conductive.

In another embodiment, the amplifier circuit further includes a fifth MOS transistor connected between a first power supply terminal and a source of the third MOS transistor, and a sixth MOS transistor connected to a second power supply terminal and a source of the fourth MOS transistor, the fifth and sixth MOS transistors being controlled by the control signal in such a manner that when the control signal is at the first level, the fifth and sixth MOS transistors are turned on and when the control signal is at the second level, the fifth and sixth MOS transistors are turned off.

The above and other objects, features and advantages of the present invention will be apparent from the following description of preferred embodiments of the invention with reference to the accompanying drawings.

DESCRIPTION OF THE PREFERRED EMBODIMENTS

Figure 1:
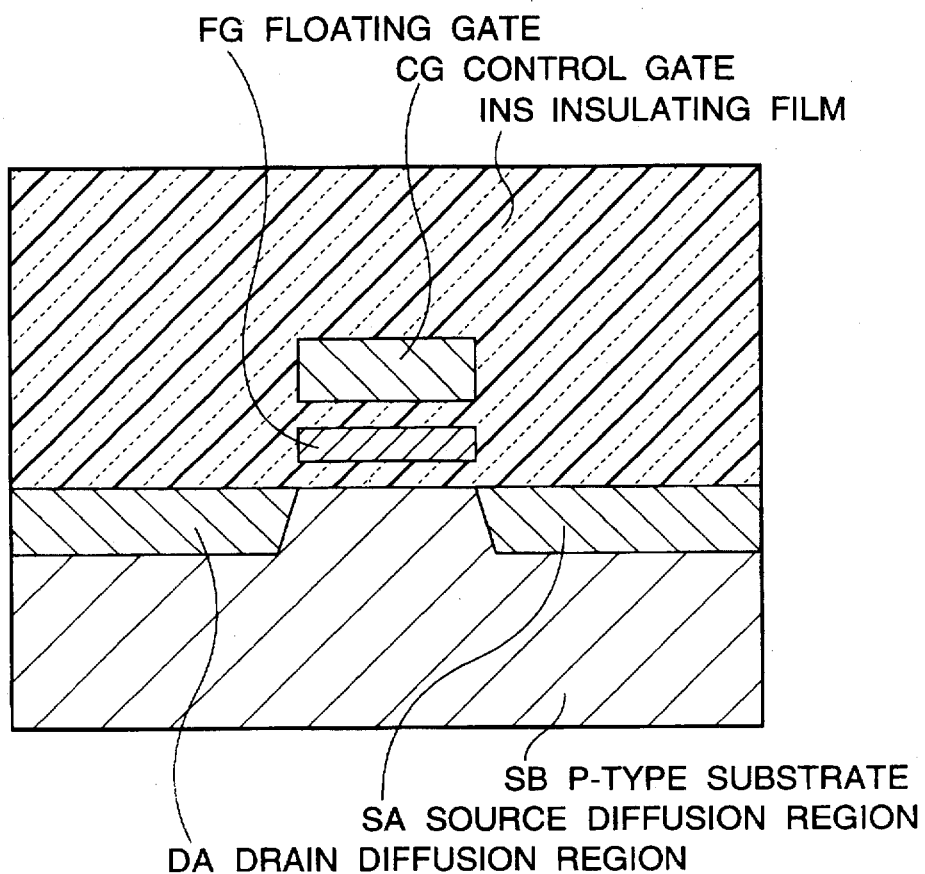
FIG. 1 is a diagrammatic sectional view of a non-volatile semiconductor memory cell composed of an electrically programmable floating gate electric field transistor.
Figure 2:
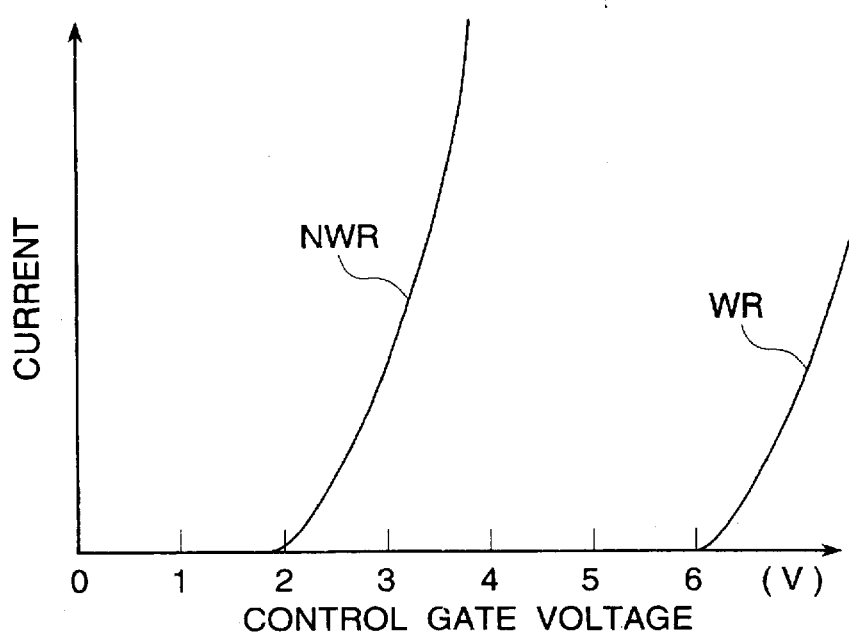
FIG. 2 is a gate voltage—current characteristics graph showing a non-written condition and a written condition of the floating gate electric field transistor.
Figure 3:
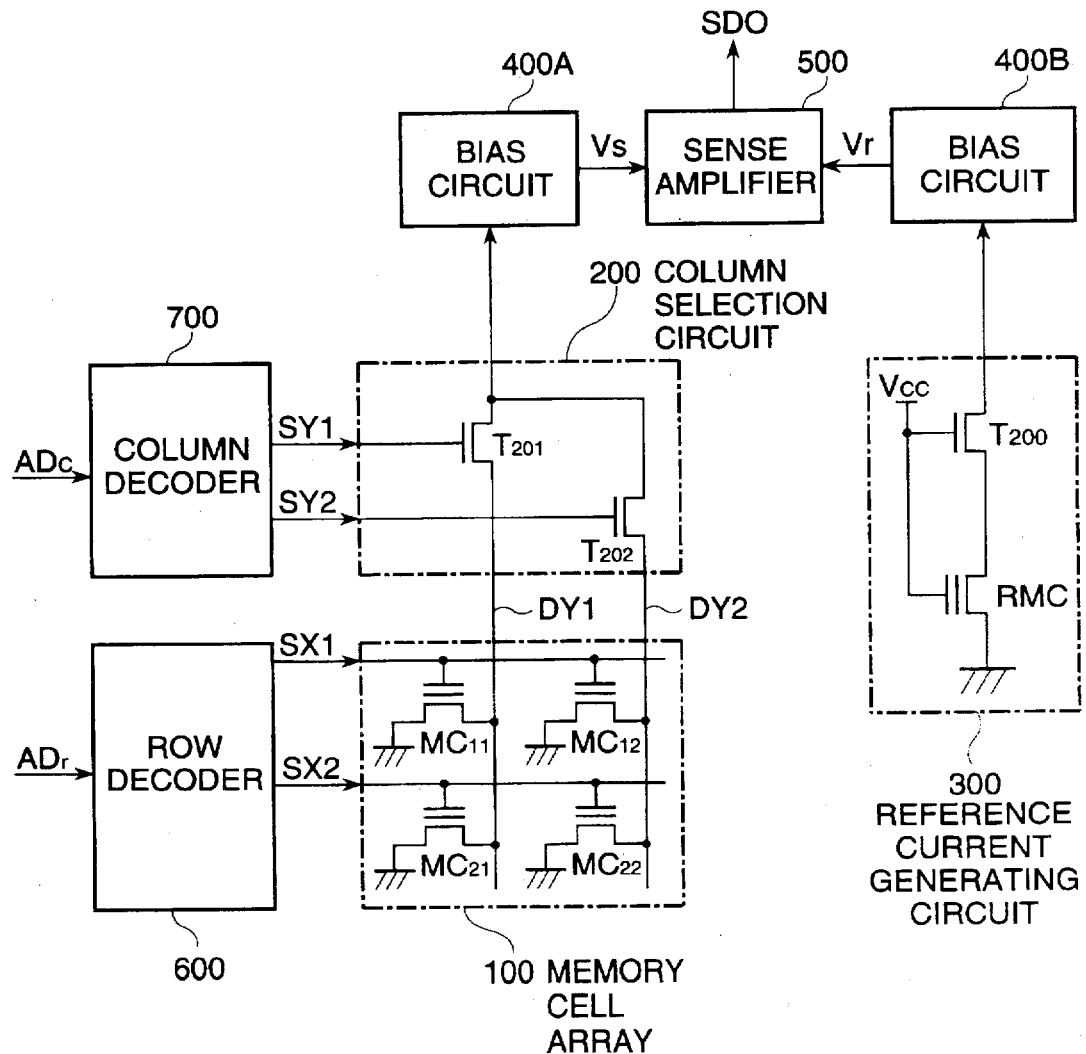
FIG. 3 is a circuit diagram illustrating a conventional construction of the actual semiconductor memory composed of floating gate electric field transistor memory cells.
Figure 9:
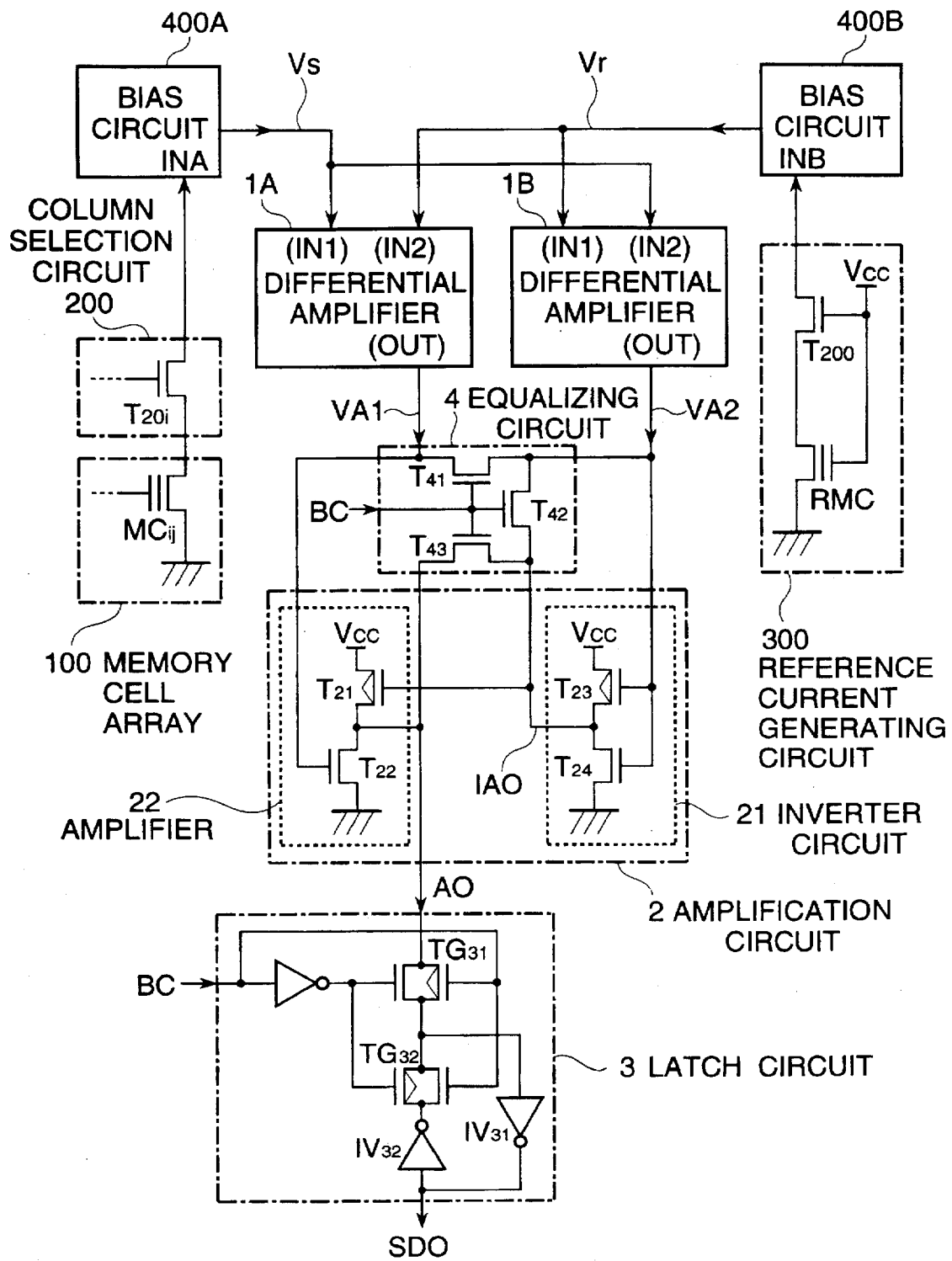
FIG. 9 is a detailed circuit diagram similar to FIG. 4, but showing a first embodiment of the sense amplifier in accordance with the present invention.

Referring to FIG. 9, there is shown a circuit diagram of a first embodiment of the sense amplifier in accordance with the present invention. In FIG. 9, elements similar or corresponding to those shown in FIGS. 3 and 4 are given the same Reference Numerals, and explanation thereof will be omitted.

Figure 4:
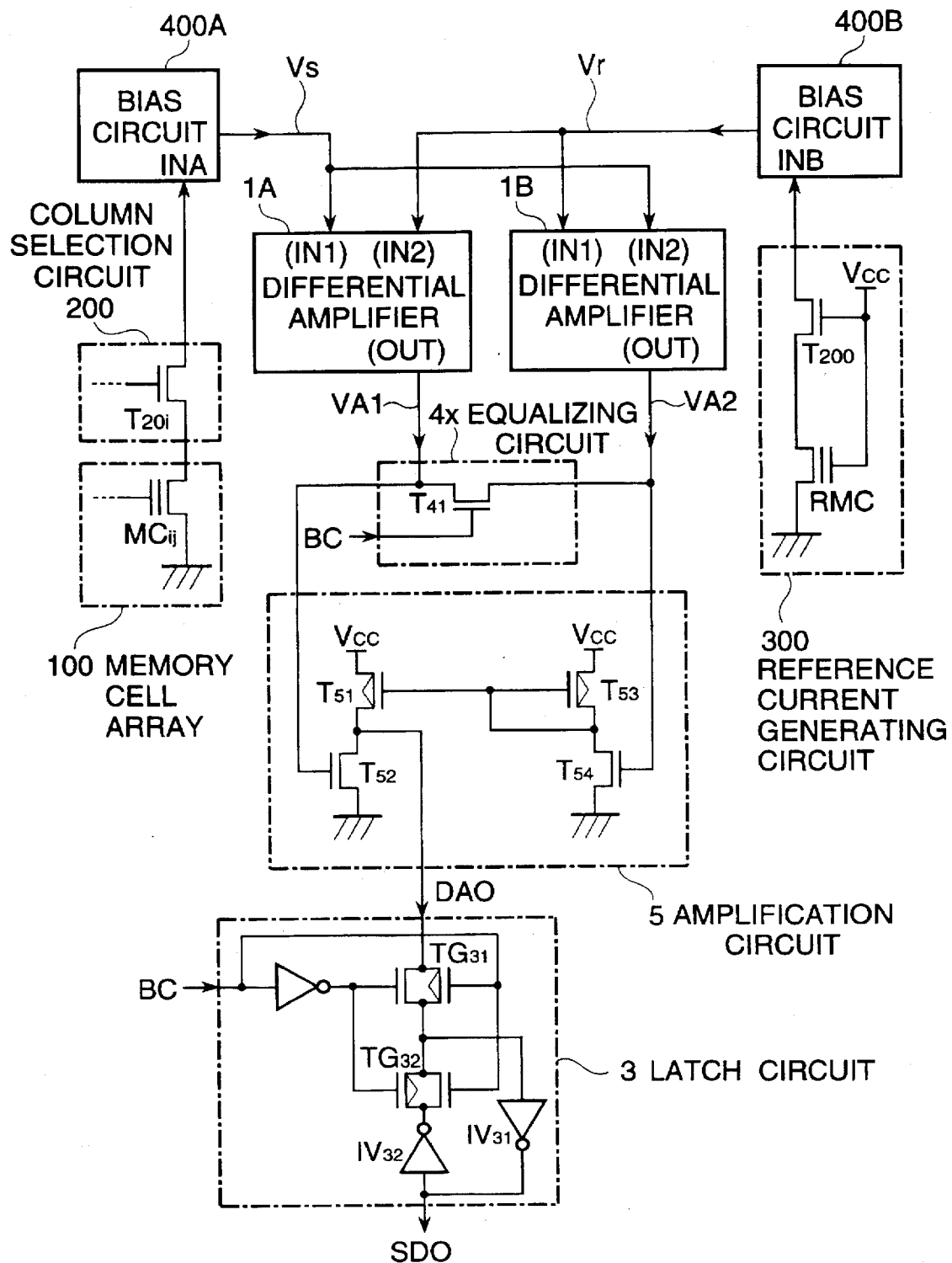
FIG. 4 is a detailed circuit diagram of the sense amplifier shown in FIG. 3.
Figure 5A:
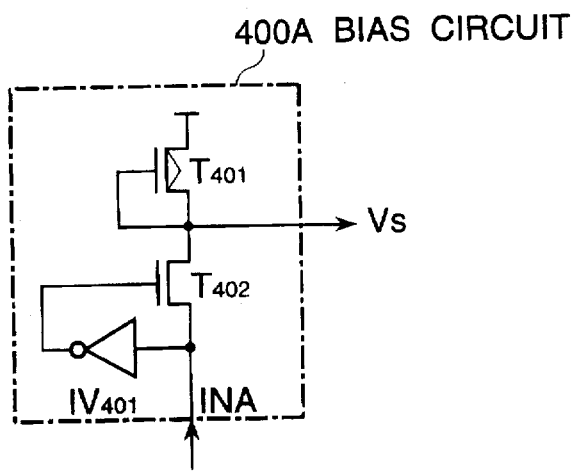
FIGS. 5A, 5B and 5C are circuit diagrams of the two bias circuits 400A and 400B and the differential amplifiers 1A and 1B shown in FIG. 4, respectively.
Figure 5B:
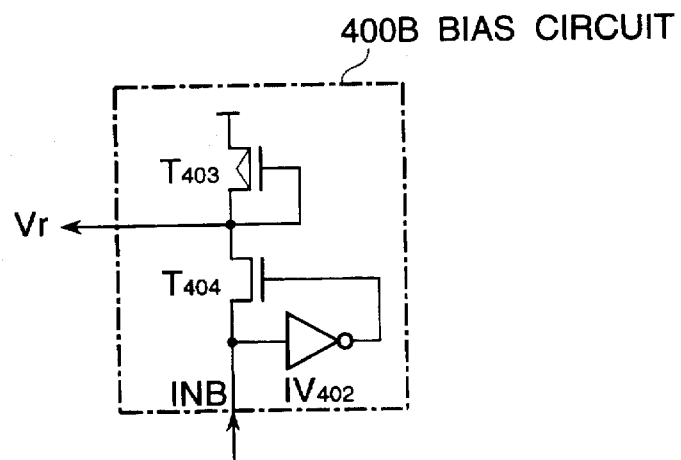
Figure 5C:
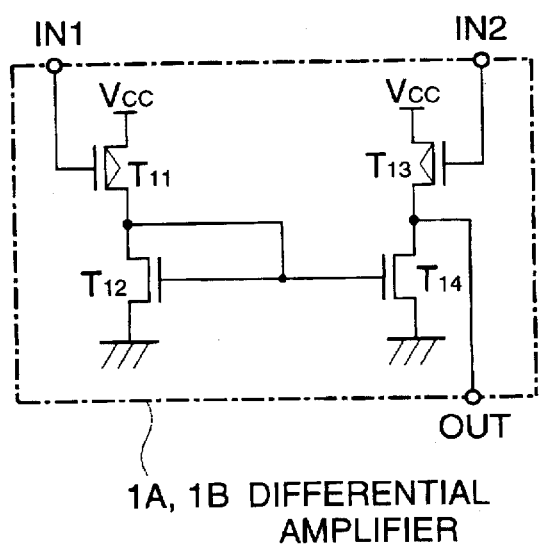
Figure 6A:
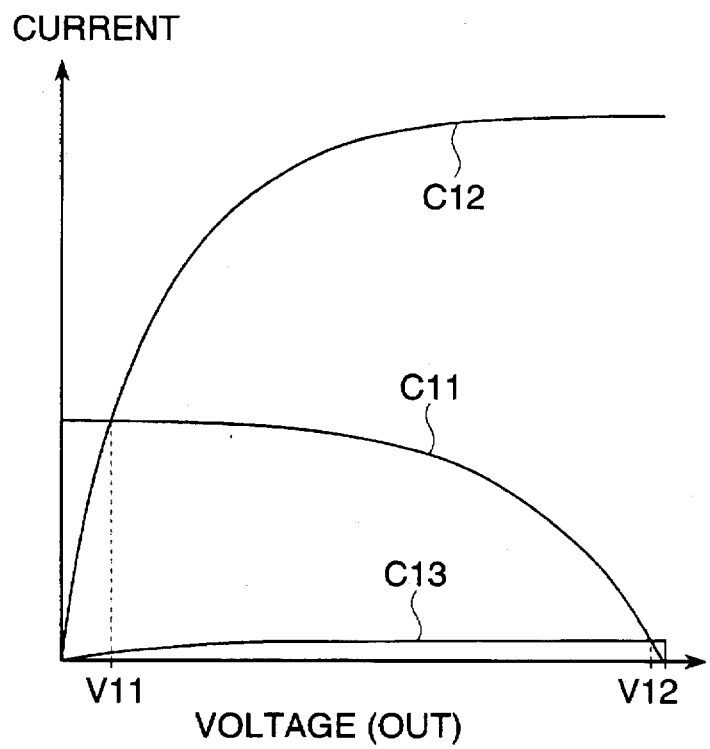
FIG. 6A illustrates a voltage (OUT)—current characteristics graph of the differential amplifier 1A shown in FIG. 4 having the circuit construction shown in FIG. 5C.
Figure 6B:
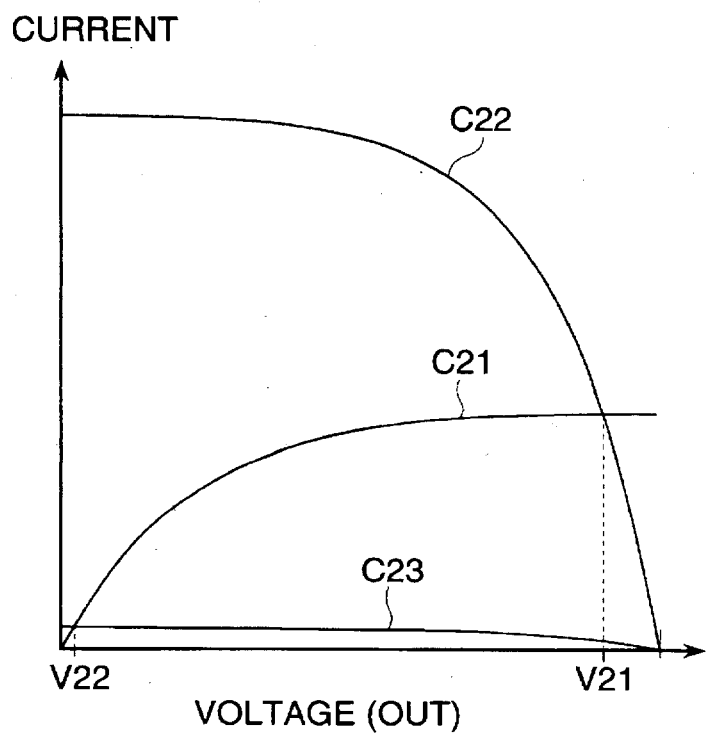
FIG. 6B illustrates a voltage (OUT)—current characteristics graph of the differential amplifier 1B shown in FIG. 4 having the circuit construction shown in FIG. 5C.
Figure 7:
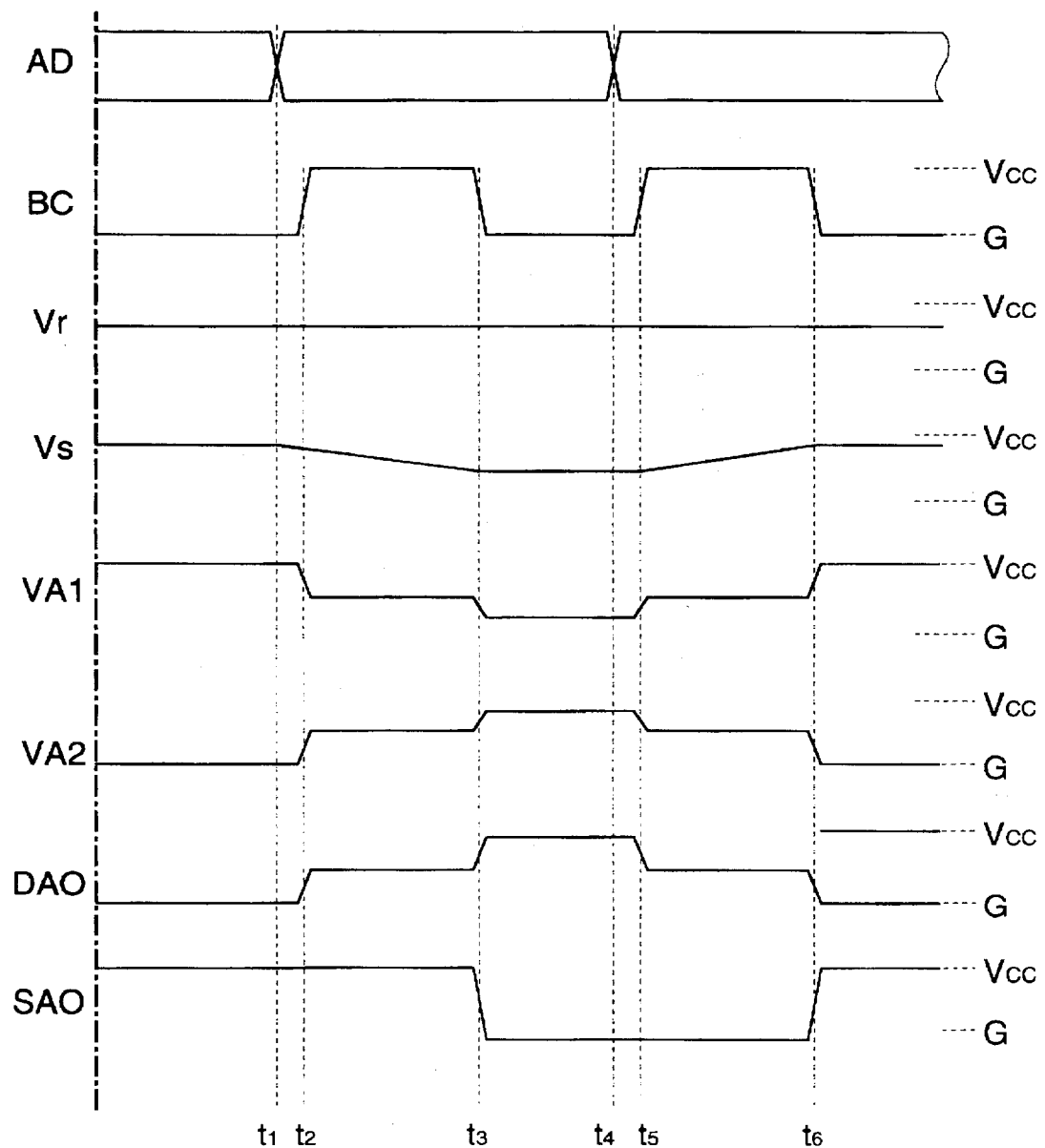
FIG. 7 is a timing chart illustrating an operation of the sense amplifier shown in FIG. 4.
Figure 8A:
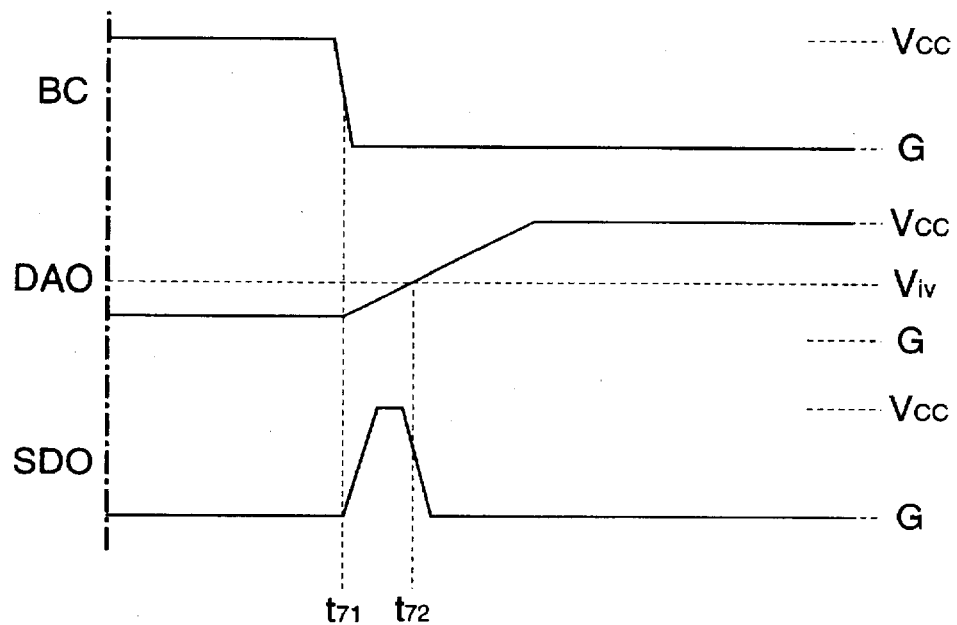
FIG. 8A is a timing chart just before and just after the termination of the equalizing when the selected memory cell changes from the non-written memory cell to the written memory cell, for the purpose of illustrating the problem of the sense amplifier shown in FIG. 4.
Figure 8B:
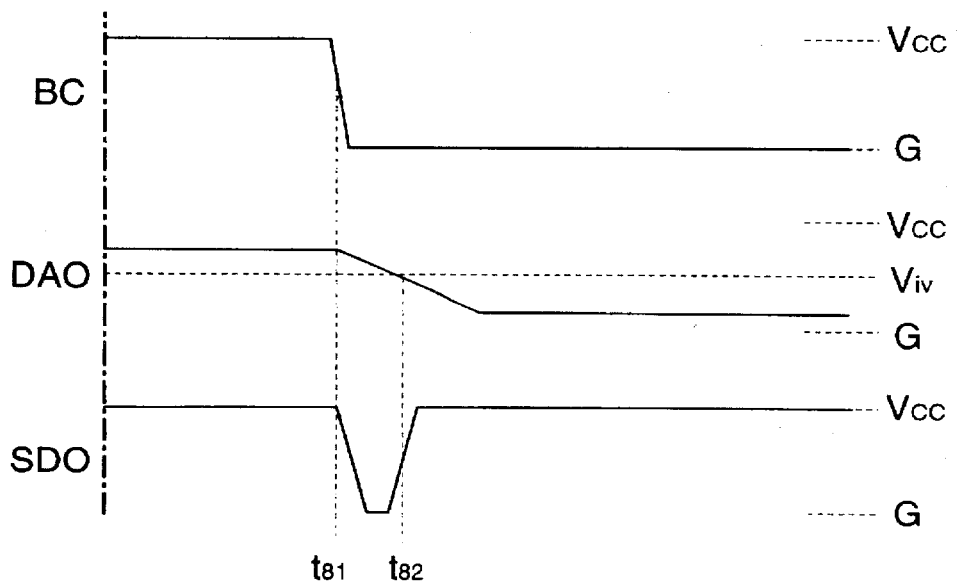
FIG. 8B is a timing chart just before and just after the termination of the equalizing when the selected memory cell changes from the written memory cell to the non-written memory cell, for the purpose of illustrating the problem of the sense amplifier shown in FIG. 4.

As seen from comparison between FIGS. 4 and 9, the embodiment shown in FIG. 9 includes an amplification circuit 2 in place of the differential amplifier 5 and also includes an equalizing circuit 4 in place of the equalizing circuit 4x.

The amplification circuit 2 comprises a CMOS inverter circuit 21 including a P-type MOS transistor T23 and an N-type MOS transistor T24 connected in series between the power supply voltage Vcc and the ground and having their gate connected in common to receive the output signal VA2 of the differential amplifier 1B. A drain of the MOS transistor T23 and a drain of the MOS transistor T24 are connected to each other so as to constitute a signal output node IAO of CMOS inverter circuit 21. This CMOS inverter circuit 21 has the same circuit construction as that of the inverter circuit IV31 of the latch circuit 3 and the same threshold voltage as that of the inverter circuit IV31 of the latch circuit 3. The amplification circuit 2 further comprises an amplifier circuit 22 including a MOS transistor T21 having the same conductivity type, the same characteristics and the same size as those of the MOS transistor T23 and having a gate receiving an output of the inverter circuit 21 so as to be on-off controlled by the output of the inverter circuit 21, and a MOS transistor T22 having the same conductivity type, the same characteristics and the same size as those of the MOS transistor T24 and having a drain connected to a drain of the MOS transistor T21 and a gate receiving the output signal VA1 of the first differential amplifier 1A so as to be on-off controlled by the output signal VA1. A common connection node between t drain of the MOS transistor T21 and the drain of the MOS transistor T22 constitutes a signal output node AO of the amplification circuit 2.

The equalizing circuit 4 includes an N-type MOS transistor T41 having a source and a drain connected to the output VA1 of the differential amplifier 1A and the output VA2 of the differential amplifier 1B, respectively, and a gate connected to receive the control signal BC so as to be on-off controlled by the control signal BC, an N-type MOS transistor T42 having a source and a drain connected to the input VA2 and the output IAO of the inverter circuit 21, respectively, and a gate connected to receive the control signal BC so as to be on-off controlled by the control signal BC, and an N-type MOS transistor T43 having a source and a drain connected to the output IAO of the inverter circuit 21 and the output AO of the amplifier circuit 22, respectively, and a gate connected to receive the control signal BC so as to be on-off controlled by the control signal BC. With this circuit construction of the equalizing circuit 4, when the control signal BC is at the high level (second level), the output of the differential amplifiers 1A and 1B, the input and the output of the inverter circuit 21 and the output of the amplification circuit 2 are equalized to assume the same potential.

Figure 10:
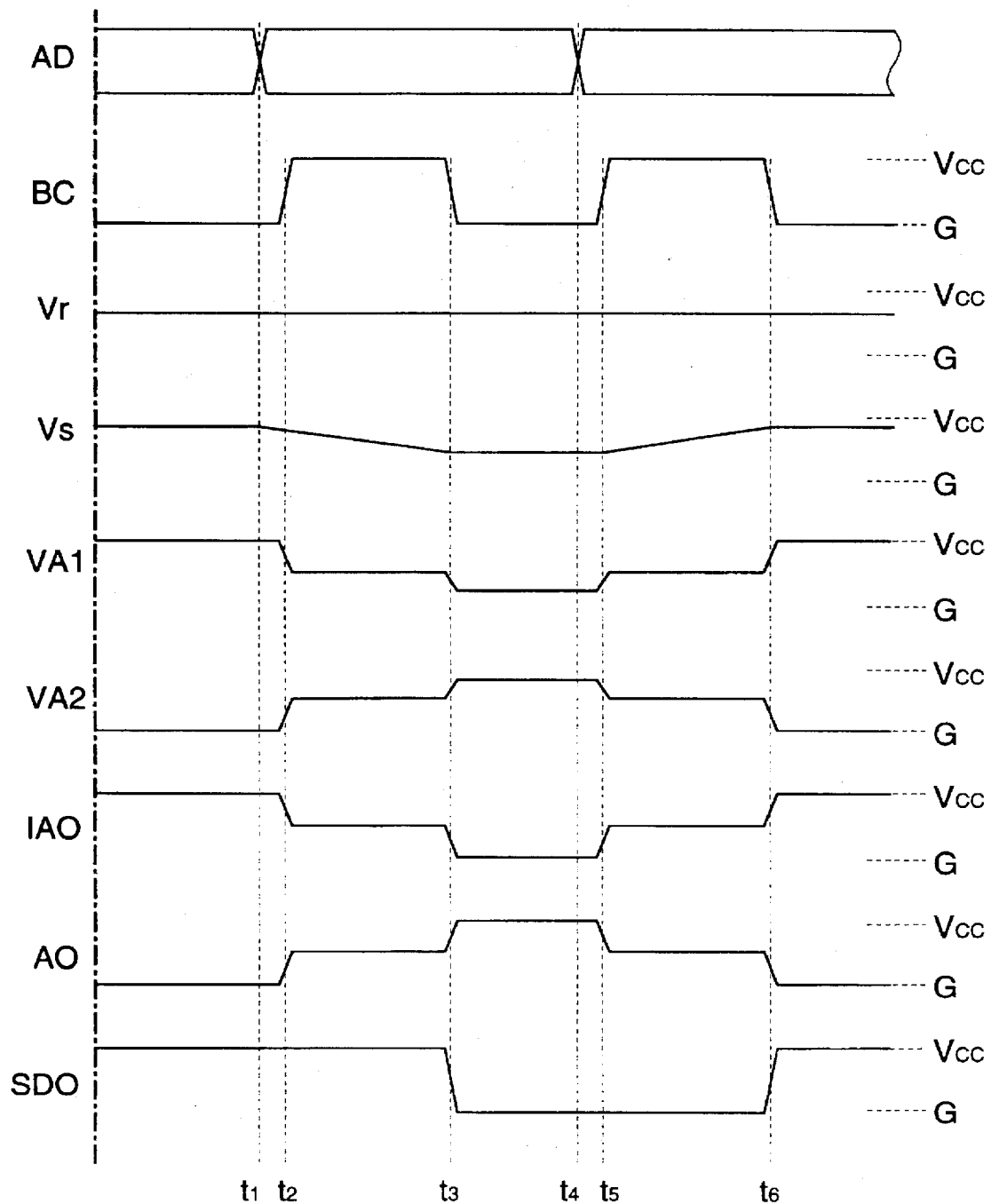
FIG. 10 is a timing chart illustrating an operation of the sense amplifier shown in FIG. 9.

Now, the operation of the circuit will be described with reference to FIG. 10, which is a timing chart illustrating the operation of the sense amplifier shown in FIG. 9.

Before a time t1, a memory cell in the written condition is selected, so that the output data SDO is at the high level.

Here, assume that, at the time t1, an address signal AD changes to select a memory cell in the non-written condition. During a period from a time t2 to a time t3, the control signal BC is brought to the high level, and therefore, all the transistors T41 to T43 are turned on, so that the output signals VA1 and VA2 of the differential amplifiers 1A and 1B, the output signal IAO of the inverter circuit 21 and the output AO of the amplifier circuit 22 are equalized. At this time, since the input potential and the output potential of the inverter circuit 21 are equalized by the transistor T42, the output signal VA2 and the output signal IAO are stabilized at a voltage substantially equal to the threshold voltage of the inverter circuit 21. In addition, the output signal VA1 and the output signal AO of the amplifier circuit 22 are equalized to a voltage substantially equal to the threshold voltage of the inverter circuit 21, by action of the MOS transistors T41 and T43.

On the other hand, the column line is discharged by the memory cell selected in the equalizing period, so that the output Vs of the bias circuit 400A changes from 4 V to 2 V, similarly to the conventional example. Thereafter, at the time t3, the control signal BC is brought to the low level, and therefore, the equalizing is completed. Thus, the voltage VA1 changes to the low level and the voltage VA2 changes to the high level, so that the output signal IAO of the inverter circuit IV21 changes to the low level. As a result, since the gate of the MOS transistor T21 is at the low level, the MOS transistor T21 is rendered conductive, and since the gate of the MOS transistor T22 is at the low level, the MOS transistor T22 is rendered non-conductive, with the result that the output signal AO of the amplifier circuit 2 is brought to the high level by action of the MOS transistor T21, and therefore, the output data signal SDO changes to the low level.

Also assume that at a time t4, the address signal AD changes so as to select a memory cell in the written condition. During a period from a time t5 to a time t6, the control signal BC is brought to the high level, and therefore, all the transistors T41 to T43 are turned on, so that the output signals VA1 and VA2 of the differential amplifiers 1A and 1B, the output signal IAO of the inverter circuit 21 and the output AO of the amplifier circuit 22 are equalized. At this time, since the input potential and the output potential of the inverter circuit 21 are equalized by the transistor T42, the output signal VA2 and the output signal IAO are stabilized at a voltage substantially equal to the threshold voltage of the inverter circuit 21. In addition, the output signal VA1 and the output signal AO of the amplifier circuit 22 are equalized to a voltage substantially equal to the threshold voltage of the inverter circuit 21, by action of the MOS transistors T41 and T43.

On the other hand, the column line connected to the selected memory cell selected in the equalizing period is charged, so that the output Vs of the bias circuit 400A changes from 2 V to 4 V, similarly to the conventional example. Thereafter, at the time t6, the control signal BC is brought to the low level so as to terminate the equalizing. As a result, the voltage VA1 changes to the high level and the voltage VA2 changes to the low level, so that the output signal IAO of the inverter circuit 21 changes to the high level. Thus, since the gate of the MOS transistor T21 is at the high level, the MOS transistor T21 is rendered non-conductive, and since the gate of the MOS transistor T22 is at the high level, the MOS transistor T22 is rendered conductive, with the result that the output signal AO of the amplifier circuit 2 is brought to the low level by action of the MOS transistor T22, and therefore, the output data signal SDO changes to the high level.

Next, explanation will be made on an operation just before and just after the termination of the equalizing with reference to FIGS. 11A and 11B.

Figure 11A:
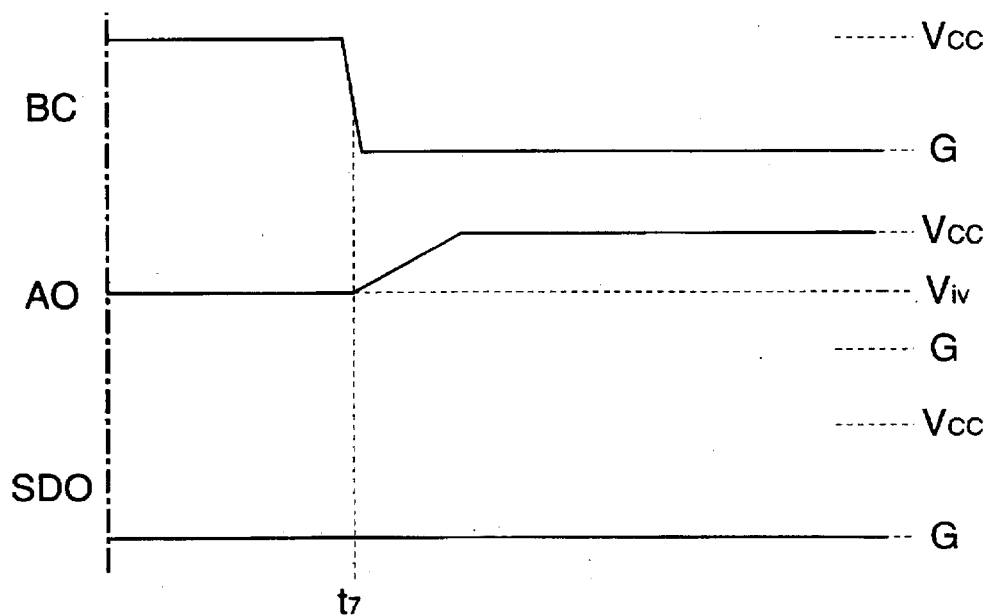
FIG. 11A is a timing chart just before and just after the termination of the equalizing when the selected memory cell changes from the non-written memory cell to the written memory cell, for the purpose of illustrating the advantage of the sense amplifier shown in FIG. 9.

FIG. 11A is a timing chart just before and just after the termination of the equalizing when the selected memory cell changes from the non-written memory cell to the written memory cell. During the equalizing period, the potential of the output signal AO of the amplifier circuit 2 is at a voltage substantially equal to the threshold voltage of the inverter circuit 21. On the other hand, since the inverter circuit 21 and the inverter IV31 of the latch circuit 3 are designed and manufactured to have the same threshold, the potential of the output signal AO of the amplifier circuit 2 is equal to the threshold voltage Viv of the inverter circuit IV31. Accordingly, in the process that the control signal BC changes at a time t7 and the output signal AO changes towards the high level, the potential of the output signal AO changes from the threshold voltage Viv of the inverter circuit IV31 to high level as the same time as the control signal BC changes at a time t7. The output of the latch circuit 3, namely, the output data SDO of the sense amplifier in the shown embodiment is maintained at the low level. Namely, an error data is outputted temporarily, differently from the conventional example, and the operation speed is not lowered.

Figure 11B:
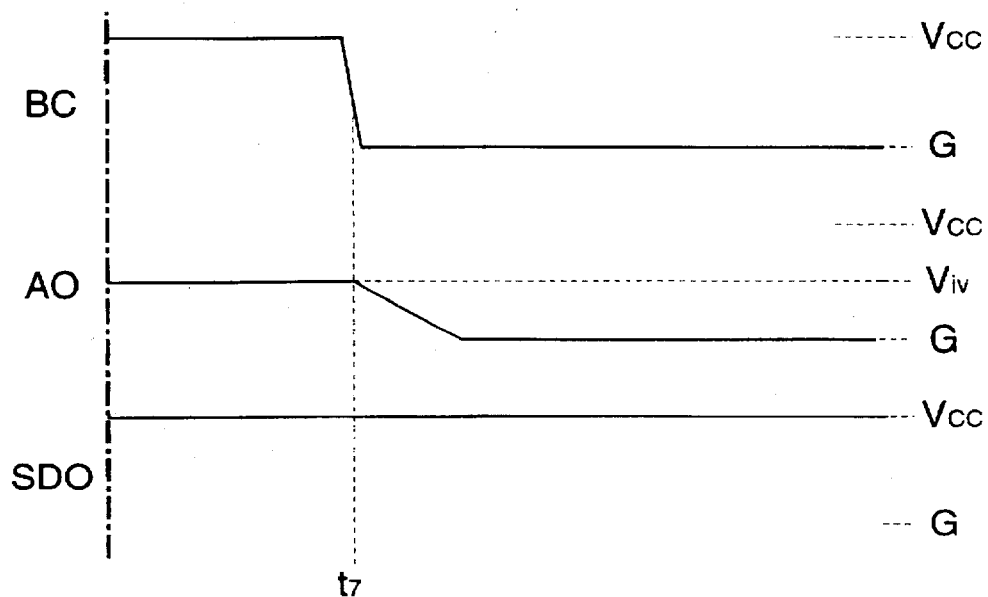
FIG. 11B is a timing chart just before and just after the termination of the equalizing when the selected memory cell changes from the written memory cell to the non-written memory cell, for the purpose of illustrating the advantage of the sense amplifier shown in FIG. 9.

FIG. 11B is a timing chart just before and just after the termination of the equalizing when the selected memory cell changes from the written memory cell to the non-written memory cell. Similarly to the operation shown in FIG. 11A, the potential of the output signal AO of the amplifier circuit 2 becomes a voltage equal to the threshold voltage Viv of the inverter circuit IV31. Accordingly, in the process that the control signal BC changes at a time t7 and the output signal AO changes towards the low level, the potential of the output signal AO changes from the threshold voltage Viv of the inverter circuit IV31 to the low level as the same time as the control signal BC changes. The output of the latch circuit 3, namely, the output data SDO of the sense amplifier in the shown embodiment is maintained at the high level. Namely, an error data is outputted temporarily, differently from the conventional example, and the operation speed is not lowered.

As seen from the above, even if the MOS transistors included in the sense amplifier of the shown embodiment have the variation of the threshold voltages occurring in the manufacturing process, since the inverter circuit 21 and the inverter IV31 are designed and manufactured to have the same circuit construction and the same threshold, the threshold voltage of these inverter circuit changes to ceaselessly have the same value as each other. Therefore, there appears no influence of the variation occurring in the manufacturing process.

In addition, since the inverter circuit 21 of the amplification circuit 2 is of the CMOS type, during a period other than the equalizing period, a power supply current flows only at the time of a level transition of the input signal. Therefore, the consumed electric power can be reduced. For example, since the contact power supply current of each one sense amplifier in the conventional example reaches on the order of 500 μA, a 16-bit circuit construction in accordance with the present invention can reduce a current of about 8 mA.

Figure 12:
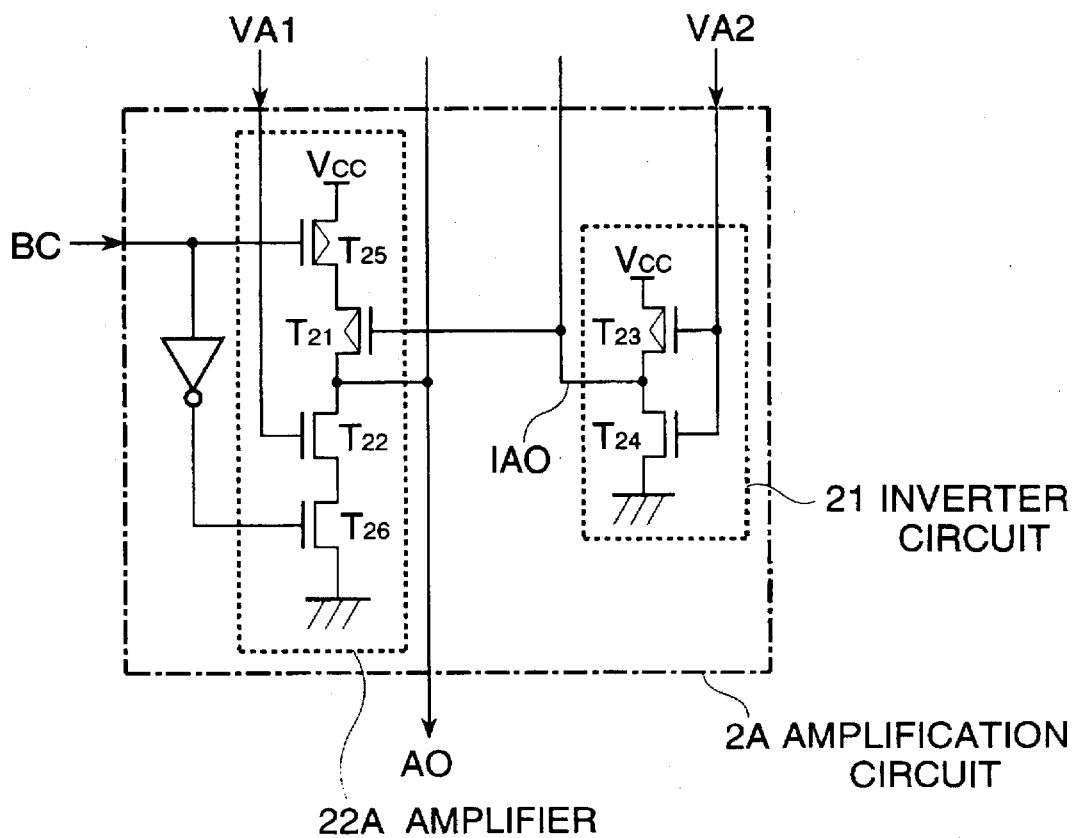
FIG. 12 is a circuit diagram of a modified embodiment of the amplifier circuit used in the sense amplifier shown in FIG. 9.

Referring to FIG. 12, there is shown a circuit diagram of a modified embodiment of the amplification circuit used in the sense amplifier shown in FIG. 9. In FIG. 12, elements similar to those shown in FIG. 9 are given the same Reference Numerals and explanation thereof will be omitted.

The shown amplification circuit is generally designated by Reference Numeral 2A, and includes the inverter circuit 21 and a modified amplifier circuit 22A. As seen from comparison between FIG. 9 and FIG. 12, the modified amplifier circuit 22A additionally includes a P-type MOS transistor T25 connected between the power supply voltage Vcc and a source of the MOS transistor T21, and having a gate receiving the control signal BC so that when the control signal BC is at the low level (first level), the MOS transistor T25 is turned on, and when the control signal BC is at the high level (second level), the MOS transistor T25 is turned off, and an N-type MOS transistor T26 connected between a source of the MOS transistor T22 and the ground, and having a gate receiving an inverted signal of the control signal BC so that when the control signal BC is at the low level, the MOS transistor T26 is turned on, and when the control signal BC is at the high level, the MOS transistor T26 is turned off.

In the first embodiment, during the equalizing period, a current flows in the inverter circuit 21 and the amplifier circuit 22 from the power supply voltage Vcc to the ground. However, in this modified embodiment, the current flowing in the inverter circuit 21 is blocked by the MOS transistors T25 and T26, and therefore, the consumed electric power can be correspondingly reduced.

In this modified embodiment, in addition, no current flows through the MOS transistors T21 and T22 during the equalizing period, these transistors give no influence to the threshold of the inverter circuit 21. Therefore, the characteristics and the size of the MOS transistors T21 and T22 may be different from those of the MOS transistors T23 and T24 in the inverter circuit 21.

In the above mentioned embodiment, the equalizing circuit 4 is composed of only the N-type MOS transistors T41 to T43, but can be formed of P-type MOS transistors in place of the N-type MOS transistors T41 to T43. In addition, the N-type MOS transistors T41 to T43 can be replaced by transfer gates, as shown in FIG. 13 which is a circuit diagram of a modified embodiment of the equalizing circuit used in the sense amplifier shown in FIG. 9.

Figure 13:
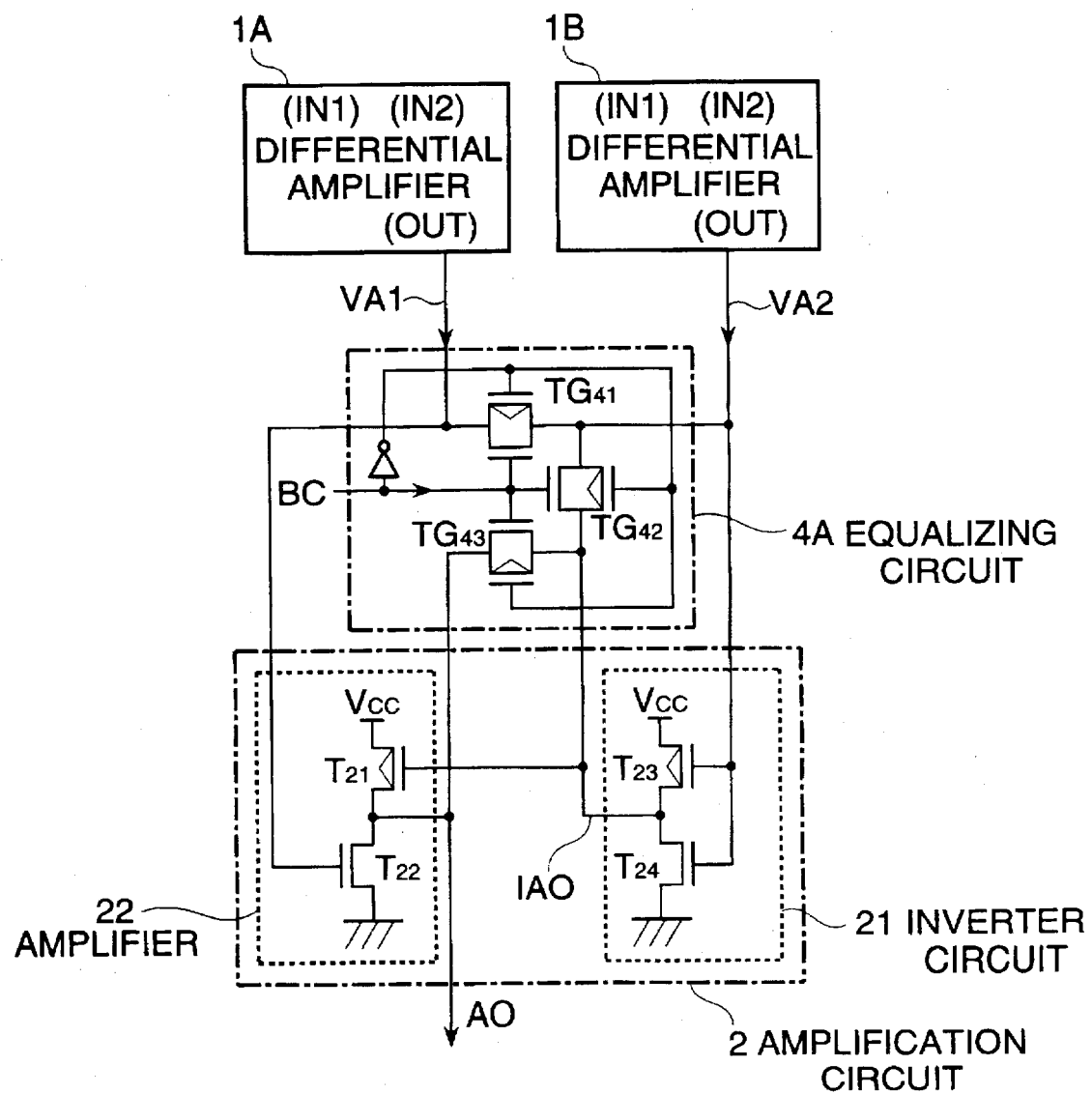
FIG. 13 is a circuit diagram of a modified embodiment of the equalizing circuit used in the sense amplifier shown in FIG. 9.

In FIG. 13, the equalizing circuit is generally designated by Reference Numeral 4A, and includes a transfer gate TG41 connected between the output VA1 of the differential amplifier 1A and the output VA2 of the differential amplifier 1B, a transfer gate TG42 connected between the input VA2 and the output IAO of the inverter circuit 21, and a transfer gate TG43 connected between the output IAO of the inverter circuit 21 and the output AO of the amplifier circuit 22. Each of the transfer gates TG41, TG42 and TG43 are composed of an N-type MOS transistor and a P-type MOS transistor connected in parallel to each other, a gate of the N-type MOS transistor receiving the control signal BC and a gate of the P-type MOS transistor receiving an inverted signal of the control signal BC so that when the control signal is at the high level, all of the transfer gates are rendered conductive.

As seen from the above, according to the present invention, even if the MOS transistors included in the sense amplifier have the variation of the threshold voltages occurring in the manufacturing process, since it is possible to make the potential of the output signal of the amplifier circuit consistent with the threshold voltage of the inverter in the latch circuit during the equalizing period, it is possible to prevent an error data from being outputted just after the termination of the equalizing period. Therefore, the operation can be speeded up and the consumed electric power can be reduced.

The invention has thus been shown and described with reference to the specific embodiments. However, it should be noted that the present invention is in no way limited to the details of the illustrated structures but changes and modifications may be made within the scope of the appended claims.

I claim:

1. A sense amplifier for use in a semiconductor memory having a plurality of memory cells, comprising:

a first differential amplifier receiving a potential signal read out from a selected memory cell and a reference potential, and having an output for outputting a first differentially amplified output;

a second differential amplifier receiving said potential signal read out from said selected memory cell and said reference potential, and having an output for outputting a second differentially amplified output amplified in a phase opposite to that of said first differential amplifier;

a first inverter circuit composed of a first MOS transistor of a first conductivity type and a second MOS transistor of a second conductivity type opposite to said first conductivity type, said first inverter circuit having a threshold level corresponding to an intermediate level between a high logic level and a low logic level of binary information, said first inverter circuit having an input receiving said second differentially amplified output and an output for outputting an inverted signal of said second differentially amplified output;

an amplifier circuit composed of a third MOS transistor of said first conductivity type having the same characteristics and the same size as those of said first MOS transistor and having a gate receiving said inverted signal of said second differentially amplified output so as to be on-off controlled by said inverted signal of said second differentially amplified output, and a fourth MOS transistor of said second conductivity type having the same characteristics and the same size as those of said second MOS transistor and having a gate receiving said first differentially amplified output so as to be on-off controlled by said first differentially amplified output, a drain of said third MOS transistor and a drain of said fourth MOS transistor being connected to each other so as to constitute a signal output node;

a latch circuit having an input connected to said signal output node of said amplifier circuit and including a second inverter circuit having the same circuit construction and the same threshold level as those of said first inverter circuit and a transfer gate connected between said input of said latch circuit and an input of said second inverter circuit and on-off controlled by a control signal in such a manner that when said control signal is at a first level, said transfer gate transfers an output signal outputted from said signal output node of said amplifier circuit to said input of said second inverter circuit, and when said control signal is at a second level different from said first level, said latch circuit hold said output signal outputted from said signal output node of said amplifier circuit so as to cause said second inverter circuit to output a sense-amplified signal; and an equalizing circuit connected to said output of each of said first and second differential amplifiers, said input and said output of said first inverter circuit and said signal output node or said amplifier circuit, and controlled by said control signal so as to equalize a potential on said output of each of said first and second differential amplifiers, said input and said output of said first inverter circuit and said signal output node of said amplifier circuit when said control signal is at said second level.

2. A sense amplifier claimed in claim 1 wherein said equalizing circuit includes a fifth MOS transistor having a source and a drain connected to said output of said first differential amplifier and said output of said second differential amplifier, respectively, and a gate connected to receive said control signal, a sixth MOS transistor having a source and a drain connected to said input and said output of said first inverter circuit, respectively, and a gate connected to receive said control signal, a seventh MOS transistor having a source and a drain connected to said output of said first inverter circuit and said output of said amplifier circuit, respectively, and a gate connected to receive said control signal.

3. A sense amplifier claimed in claim 1 wherein said equalizing circuit includes a second transfer gate connected between said output of said first differential amplifier and said output of said second differential amplifier, a third transfer gate connected between said input and said output of said first inverter circuit, a fourth transfer gate connected between said output of said first inverter circuit and said output of said amplifier circuit, each of said second, third and fourth transfer gates being composed of a MOS transistor of said first conductivity type and another MOS transistor of said second conductivity type, which are connected in parallel to each other, a gate of said MOS transistor of said first conductivity type and a gate of said MOS transistor of said second conductivity type being controlled by said control signal in such a manner that when said control signal is at said second level, all of said second, third and fourth transfer gates are rendered conductive.

4. A sense amplifier claimed in claim 1 wherein said amplifier circuit further includes a fifth MOS transistor connected between a first power supply terminal and a source of said third MOS transistor, and a sixth MOS transistor connected to a second power supply terminal and a source of said fourth MOS transistor, said fifth and sixth MOS transistors being controlled by said control signal in such a manner that when said control signal is at said first level, said fifth and sixth MOS transistors are turned on and when said control signal is at said second level, said fifth and sixth MOS transistors are turned off.

5. A sense amplifier for use in a semiconductor memory having a plurality of memory cells, comprising:

a first differential amplifier receiving a potential signal read out from a selected memory cell and a reference potential, and having an output for outputting a first differentially amplified output;

a second differential amplifier receiving said potential signal read out from said selected memory cell and said reference potential, and having an output for outputting a second differentially amplified output amplified in a phase opposite to that of said first differential amplifier;

a first inverter circuit composed of a first MOS transistor of a first conductivity type and a second MOS transistor of a second conductivity type opposite to said first conductivity type, said first inverter circuit having a threshold level corresponding to an intermediate level between a high logic level and a low logic level of binary information, said first inverter circuit having an input receiving said second differentially amplified output and an output for outputting an inverted signal of said second differentially amplified output, said first MOS transistor having a drain connected to a source of said second MOS transistor; and an amplifier circuit composed of a third MOS transistor of said first conductivity type having the same characteristics and the same size as those of said first MOS transistor and having a gate receiving said inverted signal of said second differentially amplified output so as to be on-off controlled by said inverted signal of said second differentially amplified output, and a fourth MOS transistor of said second conductivity type having the same characteristics and the same size as those of said second MOS transistor and having a gate receiving said first differentially amplified output so as to be on-off controlled by said first differentially amplified output, a drain of said third MOS transistor and a drain of said fourth MOS transistor being connected to each other so as to constitute a signal output node.

* * * * *